United States Patent
Matsuo

(10) Patent No.: US 9,488,477 B2
(45) Date of Patent: Nov. 8, 2016

(54) VIBRATING REED, ANGULAR VELOCITY SENSOR, ELECTRONIC DEVICE, MOVING OBJECT, AND METHOD FOR MANUFACTURING VIBRATING REED

(71) Applicant: Seiko Epson Corporation, Tokyo (JP)

(72) Inventor: Atsushi Matsuo, Okaya (JP)

(73) Assignee: Seiko Epson Corporation (JP)

( * ) Notice: Subject to any disclaimer, the term of this patent is extended or adjusted under 35 U.S.C. 154(b) by 197 days.

(21) Appl. No.: 14/526,942

(22) Filed: Oct. 29, 2014

(65) Prior Publication Data

US 2015/0114116 A1   Apr. 30, 2015

(30) Foreign Application Priority Data

Oct. 30, 2013   (JP) .................... 2013-226033

(51) Int. Cl.
*G01D 21/00* (2006.01)
*G01C 19/5607* (2012.01)
*H01L 41/047* (2006.01)
*H03H 9/21* (2006.01)

(52) U.S. Cl.
CPC .......... *G01C 19/5607* (2013.01); *H01L 41/047* (2013.01); *H03H 9/21* (2013.01); *Y10T 29/42* (2015.01)

(58) Field of Classification Search
CPC ... H03H 9/21; H01L 41/047; G01C 19/5607
See application file for complete search history.

(56) References Cited

U.S. PATENT DOCUMENTS

| | | | | |
|---|---|---|---|---|
| 6,791,243 B2* | 9/2004 | Kawashima | ......... | H03H 9/1021 310/319 |
| 6,898,832 B2* | 5/2005 | Kawashima | ......... | H03H 9/1021 29/25.35 |
| 6,911,765 B2* | 6/2005 | Kawashima | ....... | H03H 9/02023 310/370 |
| 7,165,452 B2* | 1/2007 | Kobayashi | ............... | G01G 3/16 73/580 |
| 7,412,886 B2* | 8/2008 | Dalla Piazza | .......... | H03H 9/215 310/370 |
| 7,802,473 B2* | 9/2010 | Endo | .................. | G01C 19/5607 73/504.16 |
| 7,872,404 B2* | 1/2011 | Numata | ................... | H03B 5/30 310/348 |
| 8,633,637 B2* | 1/2014 | Nishizawa | ......... | G01C 19/5628 310/370 |
| 9,347,776 B2* | 5/2016 | Nishizawa | ......... | G01C 19/5607 |

(Continued)

FOREIGN PATENT DOCUMENTS

| | | |
|---|---|---|
| JP | 2001-221638 A | 8/2001 |
| JP | 2011-141266 A | 7/2011 |

(Continued)

*Primary Examiner* — Laura Martin
*Assistant Examiner* — Samir M Shah
(74) *Attorney, Agent, or Firm* — Harness, Dickey & Pierce, P.L.C.

(57) ABSTRACT

The vibrating reed includes a detection unit that vibrates along the thickness direction of a piezoelectric body when detecting. The detection unit includes a first main surface and a second main surface that face each other in the thickness direction, outside surfaces, a groove that has a groove bottom at a position between the first main surface and the second main surface in a depth direction from an opening provided in the first main surface, an outside surface electrode that is formed on the outside surfaces, and an inside surface electrode that is formed on an inside surface which is opposite the outside surfaces. At least one of the outside surfaces has a non-electrode-formed area where the outside surface electrode is not provided in an area from the end surface which positioned on the second main surface side in the thickness direction to the second main surface.

20 Claims, 14 Drawing Sheets

(56) References Cited

U.S. PATENT DOCUMENTS

| | | | |
|---|---|---|---|
| 2005/0081635 A1* | 4/2005 | Kobayashi | G01G 3/16 73/580 |
| 2011/0140575 A1 | 6/2011 | Nishizawa | |
| 2011/0163638 A1* | 7/2011 | Yoshida | H03H 9/1021 310/348 |
| 2012/0103095 A1 | 5/2012 | Wada et al. | |
| 2012/0126664 A1 | 5/2012 | Ogura et al. | |
| 2012/0326570 A1* | 12/2012 | Nishizawa | H03H 3/02 310/366 |
| 2013/0026583 A1* | 1/2013 | Matsukawa | G01C 19/5628 257/415 |
| 2013/0127301 A1* | 5/2013 | Osawa | H01L 41/09 310/366 |
| 2015/0114126 A1* | 4/2015 | Matsuo | G01C 19/5607 73/651 |

FOREIGN PATENT DOCUMENTS

| | | |
|---|---|---|
| JP | 2012-098091 A | 5/2012 |
| JP | 2012-112748 A | 6/2012 |

\* cited by examiner

VIBRATING REED, ANGULAR VELOCITY SENSOR, ELECTRONIC DEVICE, MOVING OBJECT, AND METHOD FOR MANUFACTURING VIBRATING REED

BACKGROUND

1. Technical Field

The present invention relates to a vibrating reed, an angular velocity sensor, an electronic device, a moving object, and a method for manufacturing the vibrating reed.

2. Related Art

Generally, vibrating reeds have been used in angular velocity sensors (gyrosensors) (FIG. 1 of JP-A-2012-098091 and JP-A-2012-112748). In FIG. 1 of JP-A-2012-098091, for example, when an angular velocity motion about the Y axis is applied to a vibrating reed extending in the Y direction, a drive unit that is subjected to an in-plane vibration in the X direction in the X-Y plane is then changed to be subjected to an out-of-plane vibration in the Z axis direction (the thickness direction of the vibrating reed) by the action of the Coriolis force. The component of the force in the Z direction causes a detection unit to move. By such a component of the force, an electric field is generated in the X direction in the detection unit by the piezoelectric effect. Based on the electric field, the detection unit outputs an output signal; hence, the angular velocity is detected.

As a vibrating reed used in a gyrosensor, a technology is proposed in which a groove (an interference prevention portion) that is open to a side surface of a detection unit and in which the depth direction thereof is set in the X direction is provided in the detection unit (FIG. 4 of JP-A-2001-221638). The groove is arranged to prevent the electrical coupling interference between a plurality of electrodes provided on outside surfaces of the detection unit without including electrodes on the inside surface or the groove bottom thereof. This suppresses the occurrence of leakage voltage.

As another vibrating reed used in a gyrosensor, a technology is proposed in which a step portion is formed on side surfaces of a detection unit, and the distance in the X direction between a pair of electrodes formed on both side surfaces of the detection unit is narrowed so as to improve the efficiency of the electric field (FIG. 3 of JP-A-2011-141266).

When the area of electrodes arranged in a detection unit is narrowed along with the miniaturization of gyrosensors, the electric field in the X direction generated in response to the component of the force becomes weaker; and thus, the detection sensitivity decreases. It is considered to enlarge the area of the electrodes by providing a groove that is open to a main surface of the detection unit unlike in FIG. 4 of JP-A-2001-221638 and FIG. 3 of JP-A-2011-141266. However, electric charge loss may apparently occur when the position of formation of electrodes is not considered in a case where the detection unit of a vibrating reed vibrates along the thickness direction thereof such as in gyrosensors.

SUMMARY

An advantage of some aspects of the invention is to provide a vibrating reed in which the area of electrodes can be enlarged, and the detection sensitivity can be improved by increasing the efficiency of an electric field even when the vibrating reed is miniaturized; an angular velocity sensor; an electronic device; a moving object; and a method for manufacturing the vibrating reed.

(1) An aspect of the invention relates to a vibrating reed including: a first main surface and a second main surface of a piezoelectric body, the second main surface being on a back surface of the piezoelectric body with respect to the first main surface; an outside surface that connects the first main surface and the second main surface; and a detection unit that vibrates in a direction intersecting the first main surface in which the detection unit includes a groove that has a groove bottom at a position between the first main surface and the second main surface in a depth direction from an opening provided in the first main surface; a first inside surface and a second inside surface that are provided in the inside surface facing the inside of the groove; a first outside surface and a second outside surface that are provided in the outside surface; a first inside surface electrode that is provided on the first inside surface; a first outside surface electrode that is provided on the first outside surface; a second inside surface electrode that is provided on the second inside surface; and a second outside surface electrode that is provided on the second outside surface, the piezoelectric body is included between the first outside surface and the first inside surface, the piezoelectric body is included between the second outside surface and the second inside surface, each of the first outside surface electrode and the second outside surface electrode includes an end surface positioned on the second main surface side in a direction from the first main surface to the second main surface, and at least one of the first outside surface and the second outside surface has a non-electrode-formed area where the first outside surface electrode or the second outside surface electrode is not provided in an area from the end surface to the second main surface.

In the configuration of the aspect of the invention, a compressive force is applied to one of two areas in the thickness direction that are bordered with each other with a midplane as the borderline and a tensile force is applied to the other of the two areas in the detection unit vibrating along a direction intersecting the first main surface (for example, the Z direction that is the thickness direction of the piezoelectric body). The midplane here is a plane where none of compression and tension occur. An electric field generated in response to the compressive force or the tensile force acts in the pair of electrodes (the first outside surface electrode and the first inside surface electrode, the second outside surface electrode and the second inside surface electrode, or the first outside surface electrode and the second outside surface electrode) that face each other with the piezoelectric body interposed therebetween. At this time, the direction of the electric field caused by the compressive force and the direction of the electric field caused by the tensile force are opposite to each other.

Given that a first direction (for example, the +X direction) is the direction of a first electric field generated in the pair of electrodes in the horizontal cross section (for example, the X-Z plane) of the detection unit that is orthogonal to the longitudinal direction of the detection unit, the direction of a second electric field generated in the pair of electrodes is a second direction (for example, the −X direction).

As described above, the first and the second electric fields of which the directions are opposite to each other are formed in the first and the second outside surface electrodes particularly when the first and the second outside surface electrodes are formed on the entire surface from the first main surface to the second main surface in the thickness direction. Therefore, electric charge generated by one electric field is lost due to reversed electric charge generated by the other electric field.

The deepest position of the groove from the opening is referred to as the groove bottom in this specification. The groove bottom, as the bottom of the groove, can be a flat surface or not a flat surface. The reason is that the bottom of the groove is not always formed to be flat but can be V-shaped when processed with etching, particularly wet etching.

According to the aspect of the invention, at least one of the first outside surface and the second outside surface has the non-electrode-formed area in the area from the end surface to the second main surface. Therefore, in the non-electrode-formed area, the pair of electrodes is not formed, and part or the entirety of a portion of the pair of electrodes where the reversed electric charge is generated is excluded. Consequently, electric charge loss is suppressed since securing the non-electrode-formed area in the outside surface does not cause the reversed electric field. Besides, the area of electrodes is enlarged, and the efficiency of the electric field is increased since the distance between the pair of electrodes is narrowed by forming the first and the second inside surface electrodes on the inside surface of the groove. Therefore, detection sensitivity can be improved.

(2) In the aspect of the invention, detection sensitivity G may have the following relationship: $G1+(G2-G1)\times 10\% \leq G \leq G2$ given that G1 is detection sensitivity measured when each end surface of the first outside surface electrode and the second outside surface electrode is provided in the second main surface, and G2 is detection sensitivity measured when each end surface of the first outside surface electrode and the second outside surface electrode is provided in the midplane.

The first and the second outside surface electrodes are formed on the entire surface of the first and the second outside surfaces unless a removal process is particularly performed. The detection sensitivity G1, which is an object to be compared with that in the aspect of the invention, is low because of electric charge loss caused by the reversed electric field formed in the first and the second outside surface electrodes between the midplane and the second main surface. The detection sensitivity G2, which is the most preferable example in the aspect of the invention, is high because electric charge loss described above does not occur. The detection sensitivity G of the vibrating reed in the aspect of the invention is quantitatively defined as sensitivity obtained by suppressing electric charge loss further than when the detection sensitivity G1 is obtained using the non-electrode-formed area secured in the outside surface.

(3) In the aspect of the invention, the end surface may be positioned at the substantially same position as that of the midplane.

With this configuration, detection sensitivity can be maximized by minimizing electric charge loss because the reversed electric field formed in the first and the second outside surface electrodes can be ignored when the end surface is set to be positioned at the substantially same position as that of the midplane.

(4) In the aspect of the invention, the end surface may be positioned between the midplane and the second main surface.

Detection sensitivity is increased when the end surface is positioned between the first main surface and the midplane (a first area) because the effective electrode area enlarges as the end surface is positioned closer to the midplane. Meanwhile, detection sensitivity is decreased when the end surface is positioned between the midplane and the second main surface (a second area) because electric charge loss increases as the end surface is positioned closer to the second main surface. The rate of increase in detection sensitivity that is dependent on the position of the end surface in the first area is greater than the rate of decrease in detection sensitivity that is dependent on the position of the end surface in the second area. Accordingly, setting the end surface to be positioned in the second area rather than the first area reduces dependency of the detection sensitivity on position when the position of the end surface is controlled during manufacturing (for example, during an etching process).

(5) In the aspect of the invention, the end surface may be positioned between the first main surface and the midplane.

With this configuration, the reversed electric field that causes electric charge loss is not formed in the first pair of side surface electrodes formed by the first outside surface electrode and the first inside surface electrode and the second pair of side surface electrodes formed by the second outside surface electrode and the second inside surface electrode.

(6) In the aspect of the invention, the groove bottom may be arranged at a position beyond the midplane in a depth direction from the opening.

With this configuration, the effective electrode area of the first pair of side surface electrodes formed by the first outside surface electrode and the first inside surface electrode and the second pair of side surface electrodes formed by the second outside surface electrode and the second inside surface electrode can be maximally secured. In addition, the efficiency of the electric field can be further increased when a pair of groove bottom electrodes is arranged on the groove bottom.

(7) In the aspect of the invention, the groove bottom may be arranged at the substantially same position as that of the midplane or at a position not beyond the midplane in the depth direction from the opening.

With this configuration, the effect of suppressing electric charge loss depending on the position of the end surface of the first and the second outside surface electrodes can be achieved regardless of the position of the groove bottom.

(8) In the aspect of the invention, the first inside surface electrode and the second inside surface electrode may be ground electrodes.

With this configuration, the first inside surface electrode and the second inside surface electrode may be connected to each other provided that the first inside surface electrode and the second inside surface electrode are ground electrodes. That is, manufacturing can be easier since it is not necessary to form an electrode film on the first and the second inside surfaces and the groove bottom in the groove and separate the electrode film into the first inside surface electrode and the second inside surface electrode.

(9) In the aspect of the invention, the first outside surface electrode and the second outside surface electrode may be ground electrodes.

With this configuration, the first outside surface electrode and the second outside surface electrode can shield the first inside surface electrode, the second inside surface electrode, and the pair of groove bottom electrodes; and thus, adverse effects from external noise can be reduced.

(10) In the aspect of the invention, the vibrating reed may further include a pair of main surface electrodes arranged on the second main surface at an interval.

With this configuration, by connecting the pair of main surface electrodes to the another pair of side surface electrodes with wiring, electric charge generated in the pair of main surface electrodes is stacked with the polarity thereof aligned with the polarity of electric charge generated in the another pair of side surface electrodes. Therefore, detection sensitivity can be improved.

(11) Another aspect of the invention relates to an angular velocity sensor including the vibrating reed according to any one of (1) to (10) described above and a detection circuit that detects an angular velocity on the basis of a vibration of the vibrating reed in the thickness direction.

According to this angular velocity sensor, angular velocity detection sensitivity of the angular velocity sensor can be improved without electric charge loss.

(12) Still another aspect of the invention relates to an electronic device including the angular velocity sensor according to (11) described above.

(13) Yet another aspect of the invention relates to a moving object including the angular velocity sensor according to (11) described above.

According to the electronic device and the moving object of the aspects of the invention, the electronic device and the moving object can be miniaturized even with detection sensitivity thereof maintained or improved.

(14) Still yet another aspect of the invention relates to a method for manufacturing a vibrating reed that includes a first main surface and a second main surface of a piezoelectric body, the second main surface being on a back surface of the piezoelectric body with respect to the first main surface; an outside surface that connects the first main surface and the second main surface; and a detection unit that vibrates in a direction intersecting the first main surface, the method including: forming a main body of the detection unit including a first outside surface and a second outside surface of the outside surface which face each other and a groove that has a groove bottom at a position between the first main surface and the second main surface in a depth direction from an opening provided in the first main surface; forming a first outside surface electrode and a second outside surface electrode respectively on the first outside surface and the second outside surface; forming a first inside surface electrode and a second inside surface electrode respectively on the first inside surface that is opposite the first outside surface and is facing the inside of the groove and the second inside surface that is opposite the second outside surface and is facing the inside of the groove; and removing an electrode over an area having a predetermined length from the second main surface in at least one of the first outside surface electrode and the second outside surface electrode.

According to the aspect of the invention, the non-electrode-formed area is formed on at least one of the first outside surface and the second outside surface by implementing the removal process. In the non-electrode-formed area, the pair of electrodes is not formed, and part or the entirety of a portion of the pair of electrodes where the reversed electric charge is generated is excluded. Consequently, electric charge loss is suppressed since securing the non-electrode-formed area in the outside surface does not cause the reversed electric field. Besides, the area of electrodes is enlarged, and the efficiency of the electric field is increased since the distance between the pair of electrodes is narrowed by forming the first and the second inside surface electrodes on the inside surface of the groove. Therefore, detection sensitivity can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the accompanying drawings. The present embodiment described below does not intend to limit the content of the invention described in the appended claims. It can be said that all of configurations described in the present embodiment are not essential for the solution of the invention.

1. Overview of Vibrating Reed

Figure 1:
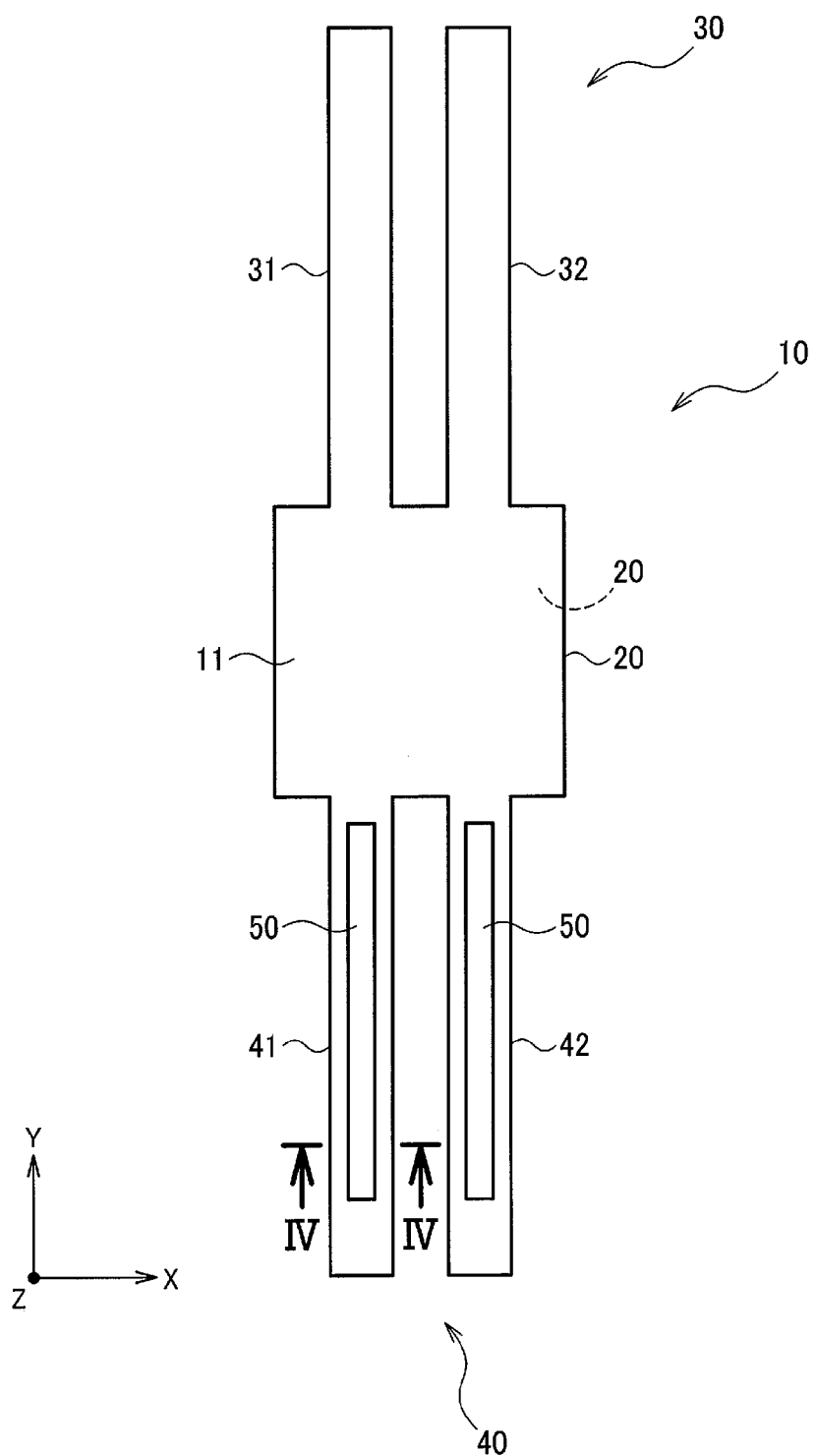
FIG. 1 is a plan view schematically illustrating a vibrating reed before electrodes are formed according to an embodiment of the invention.

FIG. 1 schematically illustrates the main body of a vibrating reed 10 before electrodes are formed. The vibrating reed 10 of the present embodiment extends in the X-Y plane formed by the X axis (a second axis) and the Y axis that is orthogonal to the X axis on a plane and has a first main surface 11 and a second main surface 12 that face each other. The Z axis is defined to be an axis that is perpendicular to the first main surface 11 and the second main surface 12. The X axis is an electrical axis, the Y axis is a mechanical axis, and the Z axis is an optical axis when a piezoelectric body that forms the vibrating reed 10 is a quartz crystal. The vibrating reed 10 includes a drive unit 30 that extends in the +Y direction from a base portion 20 and a detection unit 40 that extends in the −Y direction from the base portion 20. In addition, as disclosed in JP-A-2012-112748, additional structures such as adjustment units (vibrating arms and electrodes for adjustments) that adjust suppression of leakage output may be provided in the vibrating reed 10.

The drive unit 30 includes a first vibrating arm 31 and a second vibrating arm 32. The base portion 20, the first vibrating arm 31, and the second vibrating arm 32 constitute a tuning-fork vibrating reed. The detection unit 40 includes a third vibrating arm 41 and a fourth vibrating arm 42. The base portion 20, the third vibrating arm 41, and the fourth vibrating arm 42 constitute a tuning-fork vibrating reed as above. These two tuning-fork vibrating reeds are coupled with the base portion 20. The vibrating reed 10 having such a configuration is called an H-shaped vibrating reed.

Figure 2:
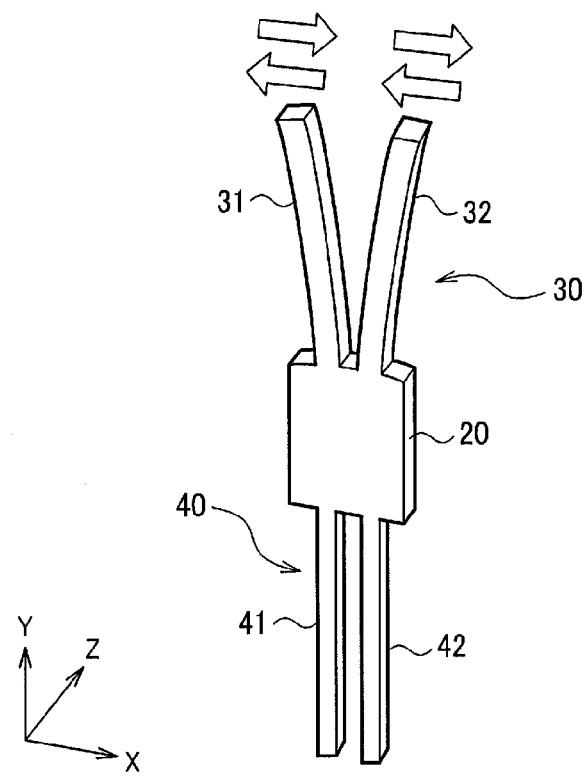
FIG. 2 is an operational diagram illustrating an in-plane vibration of a drive unit of the vibrating reed.

The vibrating reed 10 can be used as a gyrosensor (angular velocity sensor). As illustrated in FIG. 2, a vibration is driven to be excited in the drive unit 30 (the first and the second vibrating arms 31 and 32) when an angular velocity is detected. The vibration driven at this time is an in-plane vibration along the X direction in the X-Y plane. The first and the second vibrating arms 31 and 32 repeatedly vibrate while approaching to or receding from each other.

Figure 3:
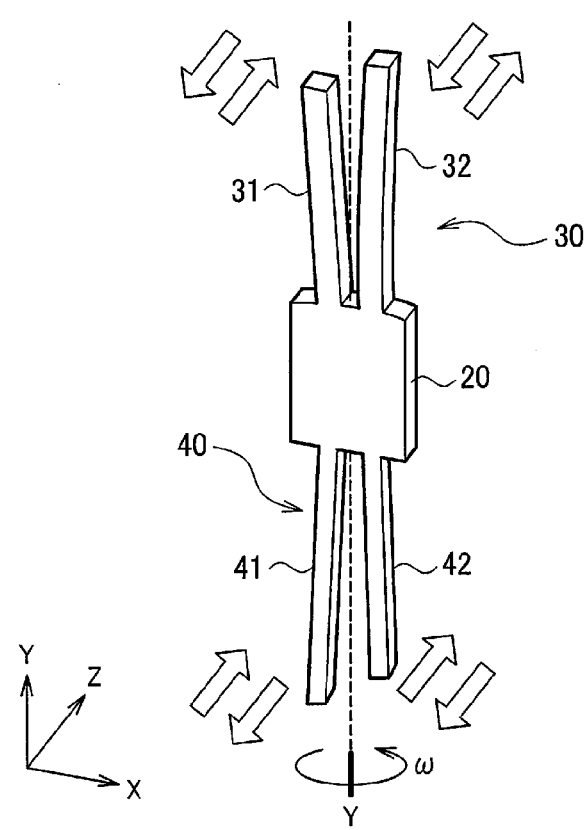
FIG. 3 is an operational diagram illustrating an out-of-plane vibration of the drive unit when an angular velocity is applied to the vibrating reed.

As illustrated in FIG. 3, when an angular velocity ω is applied to the vibrating reed 10 about the Y axis, the vibration direction of the drive unit 30 (the first and the second vibrating arms 31 and 32) is changed by the action of the Coriolis force. The first and the second vibrating arms 31 and 32 oscillate around the center of mass of the base portion 20, that is, the so-called excited vibration in the walk mode occurs.

The excited vibration of the drive unit 30 (the first and the second vibrating arms 31 and 32) in the walk mode is propagated from the base portion 20 to the detection unit 40 (the third and the fourth vibrating arms 41 and 42). As a consequence, an excited vibration in the walk mode also occurs in the detection unit 40 (the third and the fourth vibrating arms 41 and 42) around the center of mass of the base portion 20. Then, in the detection unit 40 (the third and the fourth vibrating arms 41 and 42), an electric field is generated by the piezoelectric effect, and electric charge is created.

2. Arrangement of Electrodes in Vibrating Reed 2.1. Drive Unit

Figure 12:
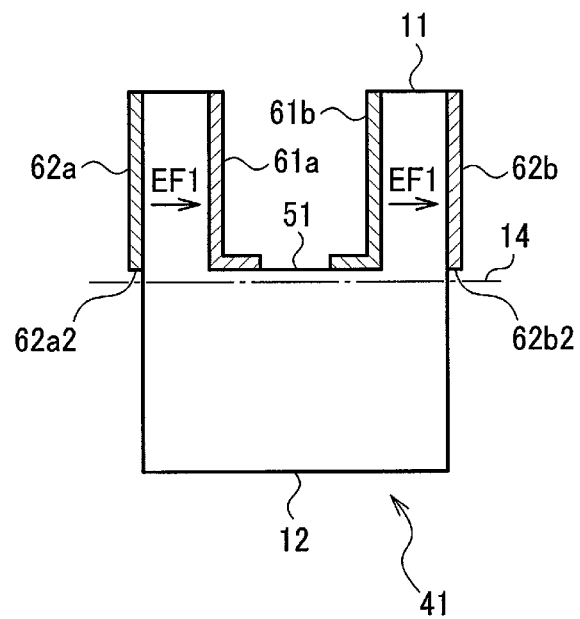
FIG. 12 is a cross-sectional diagram illustrating the detection unit of the vibrating reed in which the groove bottom is set to be at a position between the first main surface and the midplane, and the end surfaces of the outside surface electrodes are set to be at positions between the first main surface and the midplane.

In the present embodiment, arrangement of electrodes in the drive unit 30 (the first and the second vibrating arms 31 and 32) is not particularly restricted provided that the in-plane vibration in FIG. 2 is excited. The drive unit 30 (the first and the second vibrating arms 31 and 32) can include electrodes provided on four surfaces of each vibrating arm in the X-Z cross section as illustrated in FIG. 2 of JP-A-2011-141266. Alternatively, as illustrated in FIG. 12 of JP-A-2011-141266, a pair of electrodes may be formed by a single electrode provided on the inside surface and the groove bottom of the groove that is open to the main surface and a side surface electrode formed on the side surface.

2.2. Detection Unit

Arrangement of electrodes in the detection unit 40 (the third and the fourth vibrating arms 41 and 42) is featured in the present embodiment. First of all, as illustrated in FIG. 1, the detection unit 40 (the third and the fourth vibrating arms 41 and 42) is provided with openings only on the first main surface 11, and the groove 50 is provided underneath the openings with the longitudinal direction, the width direction, and the depth direction thereof respectively set as the Y axis direction, the X axis direction, and the Z axis direction.

Figure 4:
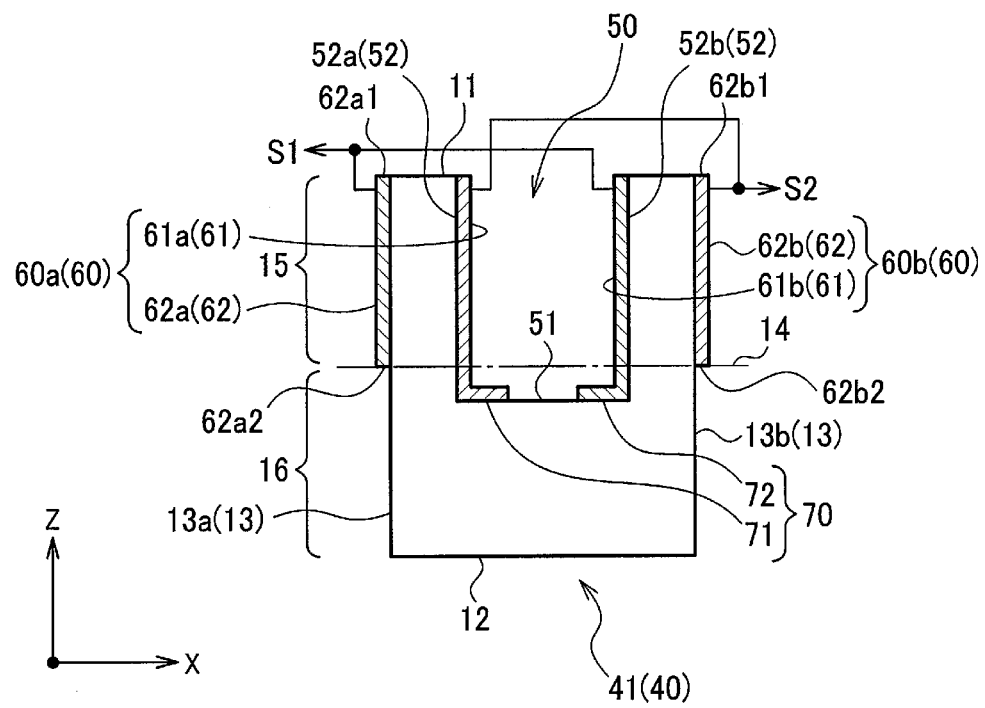
FIG. 4 is a diagram illustrating electrodes formed in the IV-IV cross section in FIG. 1.

FIG. 4 illustrates the IV-IV cross section in FIG. 1. In the X-Z cross section illustrated in FIG. 4, the groove 50 has the groove bottom 51 positioned between the first main surface 11 and the second main surface 12, for example, beyond the midplane 14 in the depth direction (the Z direction) from the first main surface 11. The groove 50 has inside surfaces 52 (a first inside surface 52a and a second inside surface 52b) that face each other across the inside of the groove 50 in the width direction X of the groove 50. The groove 50 can be formed similarly to the formation of the exterior of the vibrating reed 10, for example, by dry etching or particularly anisotropic etching.

The detection unit 40 (the third and the fourth vibrating arms 41 and 42) detects electric charge that is generated by an electric field caused by the piezoelectric effect and formed in the X direction by the vibration in the walk mode illustrated in FIG. 3. For that, a pair of electrodes is provided that face each other in the X direction. A pair of side surface electrodes 60 is included as one instance of the pair of electrodes above. The pair of side surface electrodes 60 includes an inside surface electrode 61 that faces inside the groove 50 and is formed on the inside surface 52 and an outside surface electrode 62 that is formed on the outside surface 13 which is opposite the inside surface 52. A pair of groove bottom electrodes 70 may also be included as another instance of the pair of electrodes above. The pair of groove bottom electrodes 70 is provided on the groove bottom 51 of the groove 50 at an interval. However, the pair of groove bottom electrodes 70 need not be necessarily provided.

The pair of side surface electrodes 60 can be formed by a first pair of side surface electrodes 60a and a second pair of side surface electrodes 60b. The outside surface 13 includes a first outside surface 13a and a second outside surface 13b that connect the first main surface 11 and the second main surface 12. The inside surface 52 includes the first inside surface 52a and the second inside surface 52b that face each other across the inside of the groove 50. The first inside surface 52a is opposite the first outside surface 13a with the piezoelectric body interposed therebetween. The second inside surface 52b is opposite the second outside surface 13b with the piezoelectric body interposed therebetween. The inside surface electrode 61 includes a first inside surface electrode 61a formed on the first inside surface 52a and a second inside surface electrode 61b formed on the second inside surface 52b. The outside surface electrode 62 includes a first outside surface electrode 62a formed on the first outside surface 13a and a second outside surface electrode 62b formed on the second outside surface 13b. The first pair of side surface electrodes 60a is configured of the first inside surface electrode 61a and the first outside surface electrode 62a. The second pair of side surface electrodes 60b is configured of the second inside surface electrode 61b and the second outside surface electrode 62b.

The first outside surface electrode 62a includes a first end surface 62a1 positioned on the first main surface 11 side in the thickness direction Z and a second end surface (an end surface) 62a2 positioned on the second main surface 12 side in the thickness direction Z. Similarly, the second outside surface electrode 62b includes a first end surface 62b1 positioned on the first main surface 11 side in the thickness direction Z and a second end surface 62b2 positioned on the second main surface 12 side in the thickness direction Z. The second end surfaces 62a2 and 62b2 are set to be at positions that are substantially the same as that of the midplane 14 in the present embodiment. In both of the first outside surface 13a and the second outside surface 13b, a second area 16 from each of the second end surfaces 62a2 and 62b2 to the second main surface 12 is a non-electrode-formed area where the first outside surface electrode 62a and the second outside surface electrode 62b are not formed. The first end surfaces 62a1 and 62b1 may not be formed on the outside surface 13 (13a and 13b), and may be formed on the first main surface 11.

The pair of groove bottom electrodes 70 includes a first groove bottom electrode 71 and a second groove bottom electrode 72 provided on the groove bottom 51 of the groove 50 in the width direction X of the groove at an interval. The first groove bottom electrode 71 positioned close to the first inside surface electrode 61a is connected to the first inside surface electrode 61a. That is, the first groove bottom electrode 71 is connected to the first inside surface electrode 61a at a corner of the groove 50 on the groove bottom. Similarly, the second groove bottom electrode 72 positioned close to the second inside surface electrode 61b is connected to the second inside surface electrode 61b. That is, the second groove bottom electrode 72 is connected to the second inside surface electrode 61b at a corner of the groove 50 on the groove bottom.

Output terminals S1 and S2 of the detection unit 40 are provided in the vibrating reed 10 as illustrated in FIG. 4. The output terminal S1 is connected to the first outside surface electrode 62a, the second inside surface electrode 61b, and the second groove bottom electrode 72. The output terminal S2 is connected to the second outside surface electrode 62b, the first inside surface electrode 61a, and the first groove bottom electrode 71.

3. Detection Operation

Figure 5:
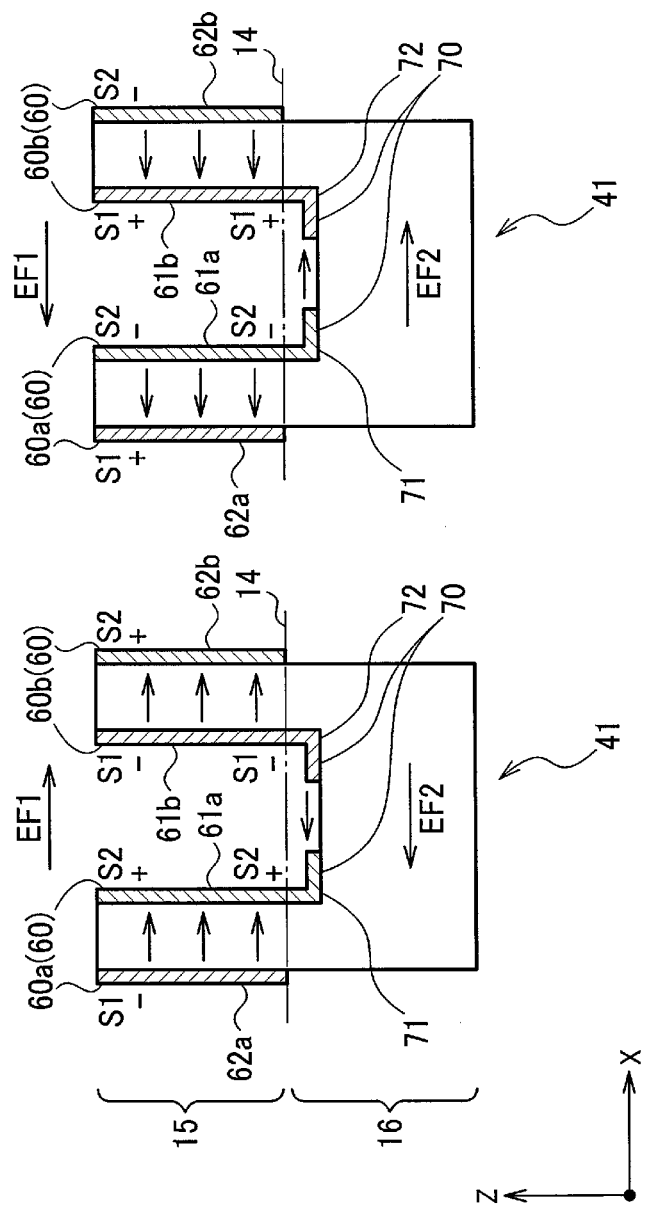
FIGS. 5A and 5B are diagrams illustrating the direction of electric fields that are alternately generated in the detection unit which is vibrating in the walk mode.

FIGS. 5A and 5B illustrate polarity of electric charge generated in the pair of electrodes while the detection unit 40 vibrates in the walk mode as illustrated in FIG. 3. FIG. 5A illustrates the detection unit 40 displaced, for example, in the +Z direction in FIG. 3. FIG. 5B illustrates the detection unit 40 displaced, for example, in the −Z direction in FIG. 3.

In the third vibrating arm 41 (the detection unit 40) vibrating along the Z direction, a compressive force is applied to one of two areas 15 and 16 and a tensile force is applied to the other of the two areas 15 and 16. The two areas 15 and 16 are bordered with each other with the midplane 14 as the borderline in the thickness direction Z as illustrated in FIGS. 5A and 5B. The midplane 14 here is a plane where none of compression and tension occur. The midplane 14 is set to be at the position that bisects the detection unit 40 in the thickness direction Z if the cross section of the detection unit 40 is rectangular. However, the cross section of the detection unit 40 is not limited to a rectangle provided that the cross section is axisymmetric about the Z axis. An electric field generated in response to the compressive force and the tensile force acts in the pair of electrodes 60 and 70 formed in the third vibrating arm 41 (the detection unit 40). At this time, the direction of the electric field caused by the compressive force and the direction of the electric field caused by the tensile force are opposite to each other.

In the horizontal cross section (the X-Z plane) of the third vibrating arm 41 (the detection unit 40) that is orthogonal to the thickness direction Z, only a first electric field EF1 is formed in the pair of side surface electrodes 60 that are arranged in the first area 15 as illustrated in FIGS. 5A and 5B. That is, a reversed electric field that causes electric charge loss to occur is not generated in the pair of side surface electrodes 60. Particularly, the effective electrode area of the pair of side surface electrodes 60 that forms the first electric field EF1 is maximized when the groove bottom 51 is positioned at the substantially same position as that of the midplane 14 or when the groove bottom 51 is positioned beyond the midplane and the second end surfaces 62a2 and 62b2 are positioned at the substantially same positions as that of the midplane 14.

Here, given that a first direction is the direction of the first electric field EF1, the direction of a second electric field EF2 that is generated in the pair of groove bottom electrodes 70 arranged in the second area 16 is a second direction which is opposite to the first direction.

As illustrated in FIG. 5A, when the first inside surface electrode 61a is positioned downstream of the first electric field EF1, the first groove bottom electrode 71 of the pair of groove bottom electrodes 70 that is close to the first inside surface electrode 61a is positioned downstream of the second electric field EF2. Similarly, in FIG. 5A, when the second inside surface electrode 61b is positioned upstream of the first electric field EF1, the second groove bottom electrode 72 of the pair of groove bottom electrodes 70 that is close to the second inside surface electrode 61b is positioned upstream of the second electric field EF2. Therefore, two connected electrodes (61a and 71 or 61b and 72) together are positioned downstream or upstream of the direction of the electric fields. That is, the output terminal S1 outputs electric charge having the same polarity, negative polarity (refer to FIG. 5A) or positive polarity (refer to FIG. 5B), from the first outside surface electrode 62a, the second inside surface electrode 61b, and the second groove bottom electrode 72. Similarly, the output terminal S2 outputs electric charge having the same polarity, positive polarity (refer to FIG. 5A) or negative polarity (refer to FIG. 5B), from the second outside surface electrode 62b, the first inside surface electrode 61a, and the first groove bottom electrode 71. For this reason, electric charge loss caused by the electric fields does not occur. Accordingly, the area of electrodes can be enlarged by the electrodes 61, 71, and 72 that are formed on the inside surface 52 and the groove bottom 51 of the groove 50. Furthermore, detection sensitivity can be improved since electric charge loss does not occur.

The fourth vibrating arm 42 of the detection unit 40 also has a cross-sectional structure similar to that in FIG. 4. However, the connection of the fourth vibrating arm 42 to the output terminals S1 and S2 is opposite to that in FIG. 4 since a phase difference between the vibrations of the third and the fourth vibrating arms 41 and 42 is 180 degrees as illustrated in FIG. 3. That is, the output terminal S2 of the fourth vibrating arm 42 is connected to the first outside surface electrode 62a, the second inside surface electrode 61b, and the second groove bottom electrode 72. The output terminal S1 is connected to the second outside surface electrode 62b, the first inside surface electrode 61a, and the first groove bottom electrode 71. The same is also applied to a modification example (FIGS. 8 to 12 and FIGS. 15 to 17) described below.

4. Detection Sensitivity

Figure 6:
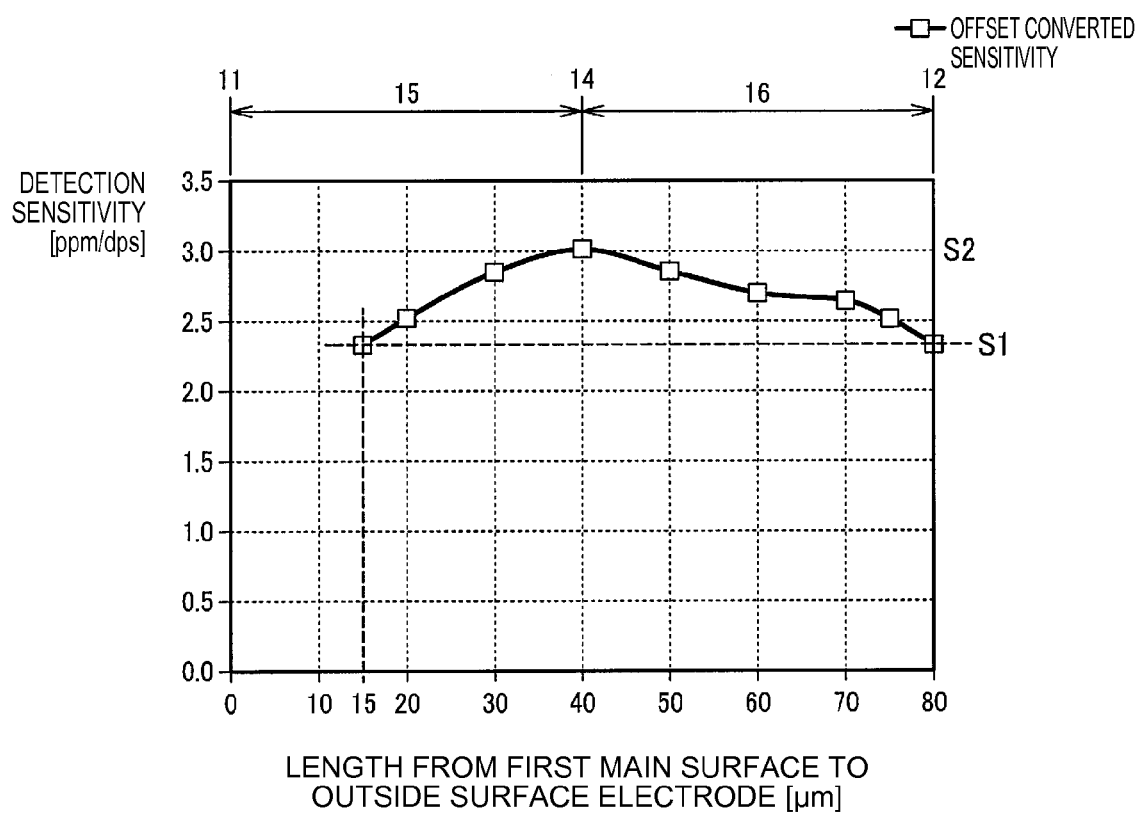
FIG. 6 is a characteristics diagram illustrating the relationship between a position and the detection sensitivity at each position from a first main surface to an end surface of an outside surface electrode.

FIG. 6 illustrates a change in detection sensitivity when the positions of the second end surfaces 62a2 and 62b2 illustrated in FIG. 4 are changed in the Z direction. In FIG. 6, the length of the detection unit 40 in the Z direction in FIG. 4 is 80 μm, and the horizontal axis denotes the length of the first and the second outside surface electrodes 62a and 62b from the first main surface 11 (0 μm to 80 μm). The vertical axis of FIG. 6 denotes detection sensitivity which is expressed as 1 kHz offset frequency converted sensitivity [ppm/dps] in FIG. 6.

In the embodiment illustrated in FIG. 4, the entire length of the first and the second outside surface electrodes 62a and 62b formed in the area from the first main surface 11 to the midplane 14 is 40 μm. Accordingly, detection sensitivity G2 is maximized when the value on the horizontal axis of FIG. 6 is 40 μm as described above.

Figure 7:
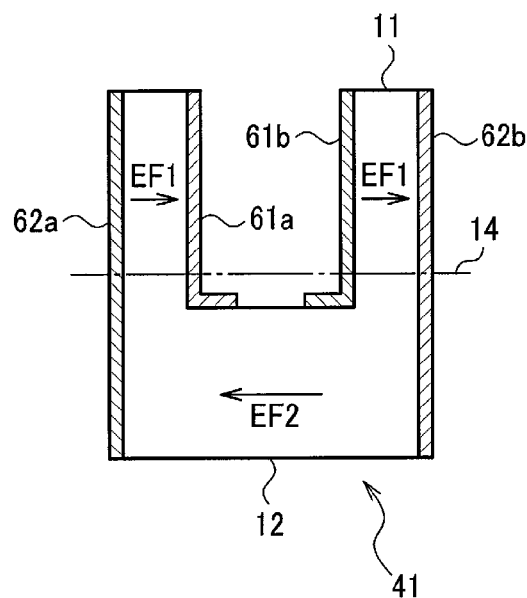
FIG. 7 is a cross-sectional diagram illustrating a detection unit of a vibrating reed according to a comparative example.

When the first and the second outside surface electrodes 62a and 62b are formed on the entire surface of the first and the second outside surfaces 13a and 13b as illustrated in a comparative example in FIG. 7, this corresponds to a value of 80 μm on the horizontal axis of FIG. 6, and detection sensitivity G1 at this time is greatly lower than the peak detection sensitivity G2 (when the value is 40 μm). The reason is that the second electric field EF2 that is formed in a third pair of side surface electrodes, which is formed in the first and the second outside surface electrodes 62a and 62b, is maximized, thereby maximizing electric charge loss.

According to FIG. 6, it is understood that the detection sensitivity G1 when the first and the second outside surface electrodes 62a and 62b are formed on the entire surface of the first and the second outside surfaces 13a and 13b as illustrated in FIG. 7 is as low as the detection sensitivity when the first and the second outside surface electrodes 62a and 62b are formed only to have a length of substantially 15 μm from the first main surface 11.

For this reason, by securing the non-electrode-formed area where the first outside surface electrode 62a or the second outside surface electrode 62b is not formed in the area from the second end surfaces 62a2 and 62b2 to the second main surface 12 rather than the example in FIG. 7, detection sensitivity G can satisfy the relationship G1 <G≤G2 and can be greater than the detection sensitivity G1 in the comparative example illustrated in FIG. 7.

Figure 8:
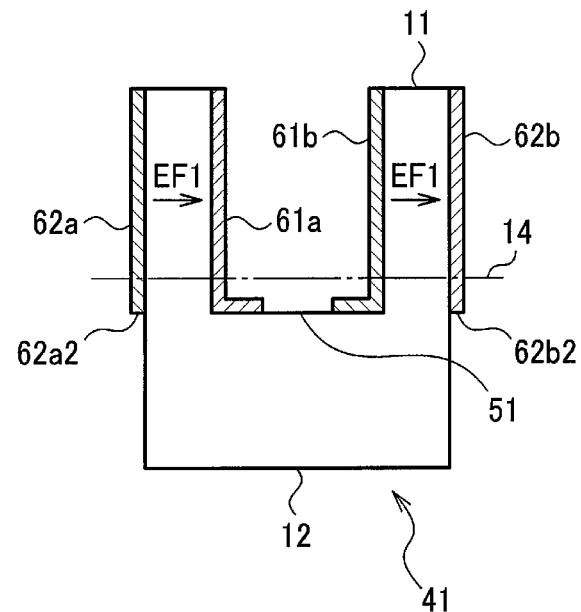
FIG. 8 is a cross-sectional diagram illustrating the detection unit of the vibrating reed in which the end surfaces of outside surface electrodes are set to be at positions of a groove bottom beyond the midplane.
Figure 9:
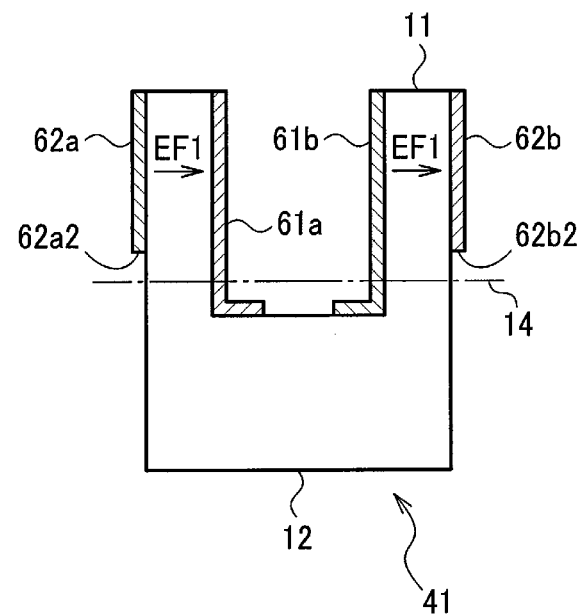
FIG. 9 is a cross-sectional diagram illustrating the detection unit of the vibrating reed in which the end surfaces of the outside surface electrodes are set to be at positions between the first main surface and the midplane.

For example, given that Expression 1 is G1 +(G2−G1)× α≤G≤G2, the coefficient α (where 0<α<1) in Expression 1 can be a minimum 10%, preferably 30% to 50%, more preferably 51% to 69%, and still more preferably 70% to 80%. Accordingly, the positions of the second end surfaces 62a2 and 62b2 may be further shifted to the second main surface 12 side than the midplane 14. For example, even when the positions of the second end surfaces 62a2 and 62b2 are substantially the same as that of the groove bottom 51 as illustrated in FIG. 8, Expression 1 can be satisfied. Alternatively, even when the positions of the second end surfaces 62a2 and 62b2 are further shifted to the first main surface 11 side than the midplane 14 as illustrated in FIG. 9, Expression 1 can be satisfied.

Here, in FIG. 6, when the value on the horizontal axis, that is, the positions of the second end surfaces 62a2 and 62b2 are in the first area 15 that is between the first main surface 11 and the midplane 14, the effective electrode area enlarges as the value on the horizontal axis, that is, the positions of the second end surfaces 62a2 and 62b2 are closer to the midplane 14. Therefore, detection sensitivity is improved. Meanwhile, when the value on the horizontal axis, that is, the positions of the second end surfaces 62a2 and 62b2 are in the second area 16 that is between the midplane 14 and the second main surface 12, electric charge loss increases as the positions of the second end surfaces 62a2 and 62b2 are closer to the second main surface 12. Therefore, detection sensitivity decreases. The rate of increase in detection sensitivity that is dependent on the positions of the second end surfaces 62a2 and 62b2 in the first area 15 is greater than the rate of decrease in detection sensitivity that is dependent on the positions of the second end surfaces 62a2 and 62b2 in the second area 16. Accordingly, dependency of the detection sensitivity on position is reduced by setting the second end surfaces 62a2 and 62b2 to be in the second area 16 rather than the first area 15 when the positions of the second end surfaces 62a2 and 62b2 are controlled during manufacturing (for example, during an etching process).

Meanwhile, when the second end surfaces 62a2 and 62b2 are set to be between the first main surface 11 and the midplane 14, a reversed electric field that causes electric charge loss to occur is not formed in the first pair of side surface electrodes 60a that is formed by the first outside surface electrode 62a and the first inside surface electrode 61a and in the second pair of side surface electrodes 60b that is formed by the second outside surface electrode 62b and the second inside surface electrode 61b.

Figure 10:
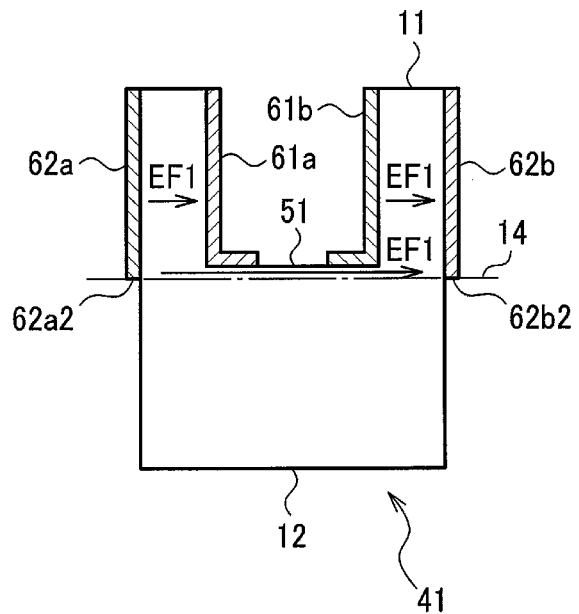
FIG. 10 is a cross-sectional diagram illustrating the detection unit of the vibrating reed in which the position of the groove bottom is set to be between the first main surface and the midplane, and the end surfaces of the outside surface electrodes are set to be at positions of the midplane.
Figure 11:
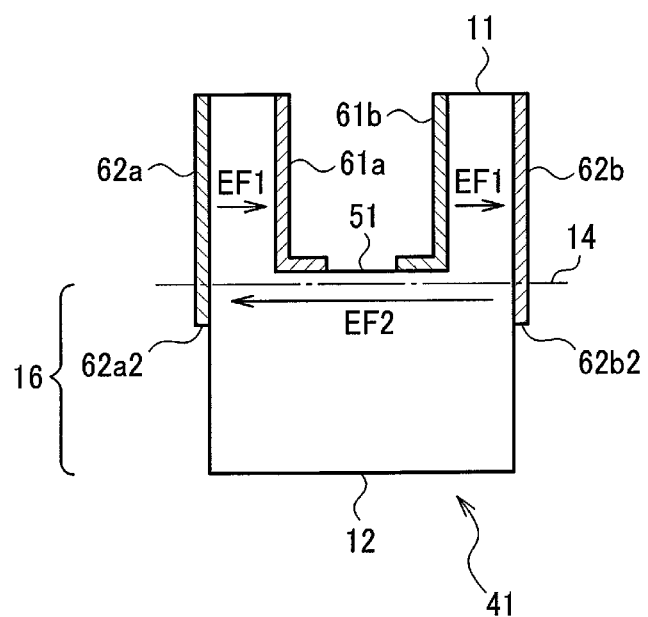
FIG. 11 is a cross-sectional diagram illustrating the detection unit of the vibrating reed in which the groove bottom is set to be at a position between the first main surface and the midplane, and the end surfaces of the outside surface electrodes are set to be at positions beyond the midplane.

The present embodiment can also be applied to a case where the groove bottom 51 is between the first main surface 11 and the midplane 14 as illustrated in FIGS. 10 to 12, and can also be applied to a case where the groove bottom 51 is in the midplane (not illustrated). In FIG. 10, the second end surfaces 62a2 and 62b2 are set to be at positions that are substantially the same as that of the midplane 14. In this case, the second electric field EF2 is not generated; and thus, electric charge loss does not occur. In FIG. 11, the second end surfaces 62a2 and 62b2 are set to be at positions between the midplane 14 and the second main surface 12. In this case, the second electric field EF2 is generated between the first and the second outside surface electrodes 62a and 62b in the second area 16. However, the rate of decrease in detection sensitivity is relatively small in the second area 16 in FIG. 6. In FIG. 12, the second end surfaces 62a2 and 62b2 are between the first main surface 11 and the midplane 14. For example, the lengths of the first and the second outside surface electrodes 62a and 62b are set to be the same as those of the first and the second inside surface electrodes 61a and 61b. In this case, the second electric field EF2 is not generated; and thus, electric charge loss does not occur. As illustrated in FIGS. 10 to 12, the pair of groove bottom electrodes 70 illustrated in FIG. 4 is not provided. The reason is that electric charge loss occurs when the pair of groove bottom electrodes 70 is provided in the first area 15 that is between the first main surface 11 and the midplane 14.

5. Gyrosensor (Angular Velocity Sensor)

Figure 13:
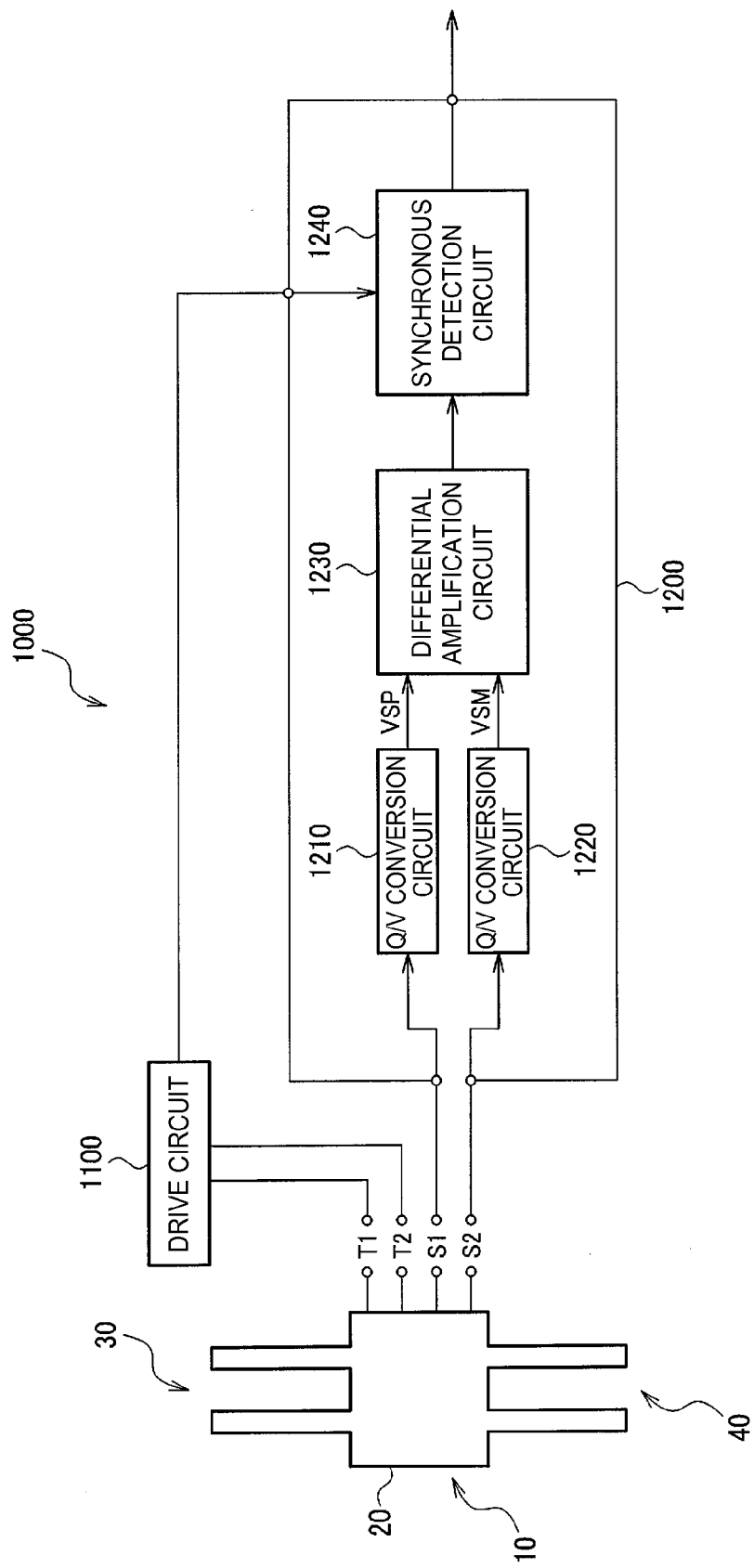
FIG. 13 is a schematic block diagram illustrating a gyrosensor that includes the vibrating reed and a detection circuit.

FIG. 13 is a schematic block diagram of a gyrosensor 1000. The gyrosensor 1000 includes the vibrating reed 10, a drive circuit 1100, and a detection circuit 1200. Drive terminals T1 and T2 and the output terminals S1 and S2 are provided in the vibrating reed 10, for example, in the base portion 20. The drive terminals T1 and T2 are connected to the drive circuit 1100, and the output terminals S1 and S2 are connected to the detection circuit 1200. The drive circuit 1100 supplies a drive signal to the drive terminals T1 and T2 and then causes the drive unit 30 to be subjected to an in-plane vibration by the piezoelectric effect, as illustrated in FIG. 2.

Figure 14:
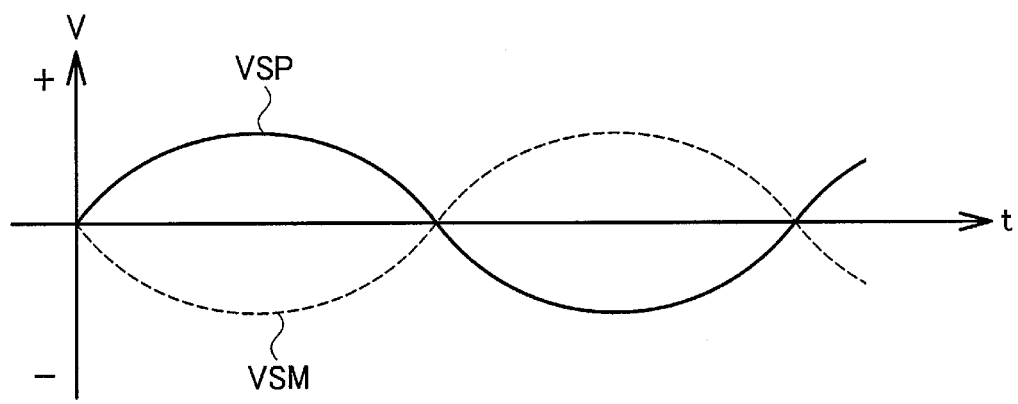
FIG. 14 is a diagram illustrating an alternating current voltage signal generated in the detection circuit.

The detection circuit 1200 includes two Q/V conversion circuits (also referred to as QV amps) 1210 and 1220. Alternating current electric charge that is generated in each of the electrodes in the vibrating reed 10 is input to the two QV amps 1210 and 1220 through the output terminals S1 and S2 of the vibrating reed 10, and is then converted to alternating current voltage signals VSP and VSM. The alternating current electric charge from the output terminal S1 and the alternating current electric charge from the output terminal S2 have a phase difference of 180 degrees between each other and have the same amplitude. Accordingly, as illustrated in FIG. 14, the QV amps 1210 and 1220 output the alternating current voltage signals VSP and VSM that have a phase difference of 180 degrees and have the same amplitude by configuring the QV amps 1210 and 1220 to have the same circuit and the same layout. The amplitude of the alternating current voltage signals VSP and VSM change depending on the magnitude of the Coriolis force (the magnitude of the angular velocity) that is applied to the vibrating reed 10. Furthermore, the amplitude of the alternating current voltage signals VSP and VSM can be increased since electric charge loss can be reduced as described above in the present embodiment.

A differential amplification circuit 1230 differentially amplifies the output signals of the QV amps 1210 and 1220 in the detection circuit 1200. Consequently, signals having the amplitude thereof twice as much as each amplitude of the alternating current voltage signals VSP and VSM are generated. Then, a synchronous detection is performed by a synchronous detection circuit 1240 based on a reference signal from the drive circuit 1100. Accordingly, only an angular velocity component is detected, and a signal (an angular velocity signal) with a voltage level corresponding to the magnitude of the angular velocity is generated. The angular velocity signal is output to an external portion through an external output terminal. For example, the angular velocity signal is A/D converted in a microcomputer and used in various processes as angular velocity data. An A/D converter may be built in the detection circuit 1000 so that digital data representing the angular velocity is output to the external portion, for example, through a serial interface.

6. Modification Example of Vibrating Reed

Figure 15:
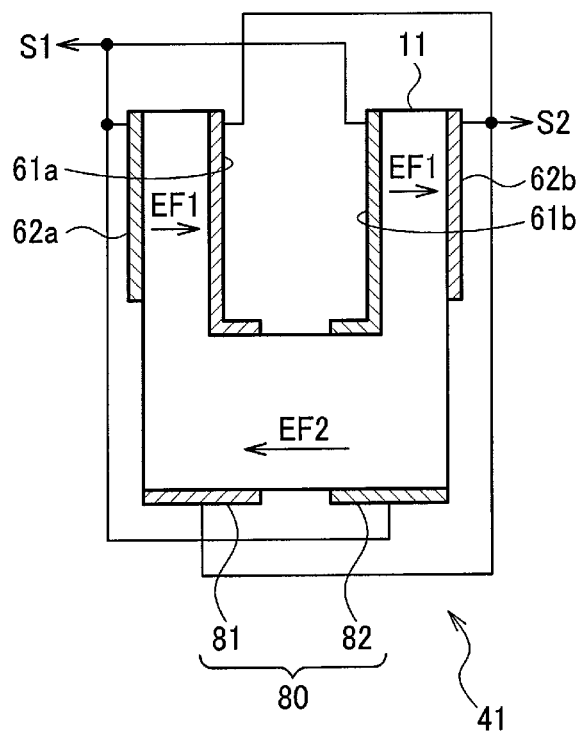
FIG. 15 is a diagram illustrating a modification example of a drive unit of a vibrating reed including a pair of main surface electrodes.
Figure 16:
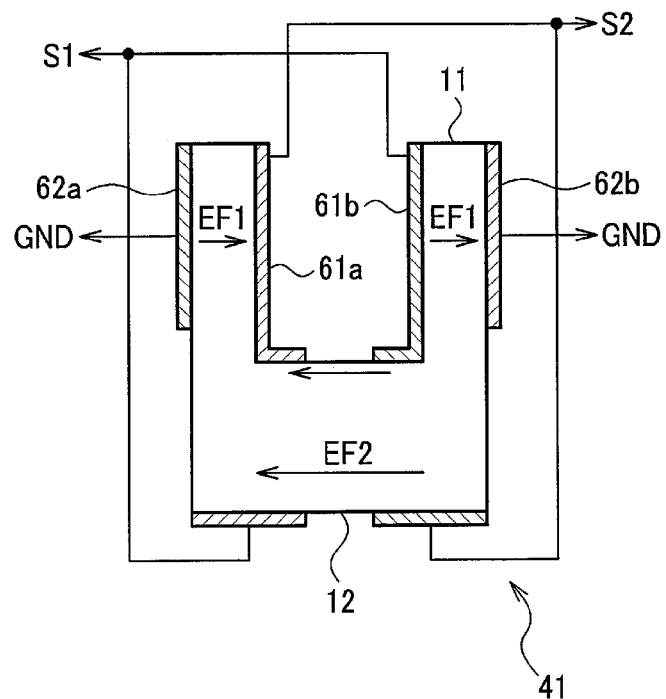
FIG. 16 is a diagram illustrating a modification example of a drive unit of a vibrating reed in which outside surface electrodes are used as ground electrodes.
Figure 17:
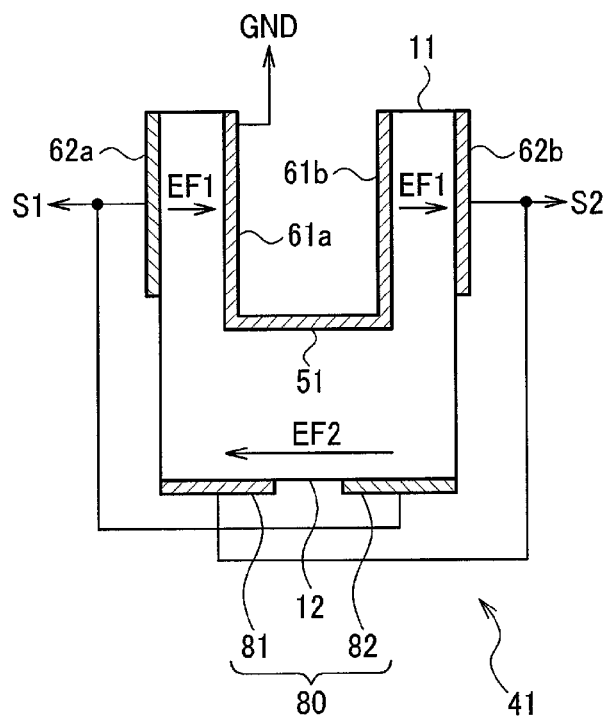
FIG. 17 is a diagram illustrating a modification example of a drive unit of a vibrating reed in which an inside surface electrode is used as ground electrodes.

FIGS. 15 to 17 illustrate modification examples of arrangement of electrodes formed in the vibrating reed 10. The detection unit 40 (a third vibrating arm 41) illustrated in FIG. 15 further includes a pair of main surface electrodes 80 that is formed by a first main surface electrode 81 and a second main surface electrode 82 arranged on the second main surface 12 at an interval. The first main surface electrode 81 is connected to the output terminal S2 that is connected to the first groove bottom electrode 71. The second main surface electrode 82 is connected to the output terminal S1 that is connected to the second groove bottom electrode 72.

Since the pair of main surface electrodes 80 and the pair of groove bottom electrodes 70 are positioned together in the second area 16 that is closer to the second main surface 12 than the midplane 14, the direction of the second electric field EF2 generated during detection is the same in both pairs of electrodes. Accordingly, electric charge loss does not occur even when the first main surface electrode 81 and the first groove bottom electrode 71 are connected to each other, and the second main surface electrode 82 and the second groove bottom electrode 72 are connected to each other. The area of electrodes is also enlarged since the pair of main surface electrodes 80 is additionally provided; therefore, the amount of electric charge can be increased.

Each of the first outside surface electrode 62a and the second outside surface electrode 62b is used as a ground electrode in the detection unit 40 (the third vibrating arm 41) illustrated in FIG. 16. As illustrated in FIG. 16, the direction of the electric fields generated in the first and the second pairs of side surface electrodes 60a and 60b and the pair of groove bottom electrodes 70 is the same as that in FIG. 4 even when the outside surface electrode 62 (62a and 62b) is used as a ground electrode. Therefore, electric charge loss does not occur. Furthermore, the grounded outside surface electrode 62 (the first outside surface electrode 62a and the second outside surface electrode 62b) can shield the first inside surface electrode 61a, the second inside surface electrode 61b, and the pair of groove bottom electrodes 70; and thus, adverse effects from external noise can be reduced. The pair of main surface electrodes 80 that is added to the example in FIG. 15 can also be provided in the structure in FIG. 16.

Each of the first inside surface electrode 61a and the second inside surface electrode 61b is used as a ground electrode in the detection unit 40 (the third vibrating arm 41) illustrated in FIG. 17. In this case, the first inside surface electrode 61a and the second inside surface electrode 61b are connected to each other by an electrode formed on the groove bottom 51. In other words, this facilitates manufacturing since a process of forming and etching a conductive film with a predetermined pattern in the groove 50 can be excluded. As illustrated in FIG. 17, the direction of the electric fields generated in the first and the second pairs of side surface electrodes 60a and 60b and the pair of groove bottom electrodes 70 is the same as that in FIG. 4 even when the inside surface electrode 61 (61a and 61b) is used as aground electrode. Therefore, electric charge loss does not occur. Furthermore, the grounded inside surface electrode 61 (the first inside surface electrode 61a and the second inside surface electrode 61b) can reduce adverse effects from external noise. The pair of main surface electrodes 80 that is added to the example in FIG. 15 can also be provided in the structure in FIG. 17.

7. Method for Manufacturing Vibrating Reed

Figure 18A:
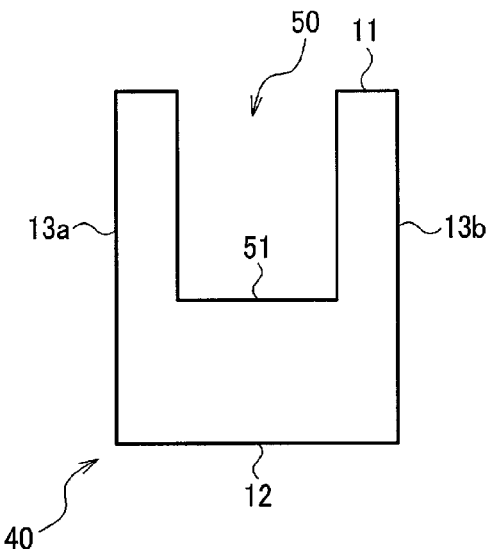
FIGS. 18A to 18C are diagrams illustrating manufacturing processes of the drive unit of the vibrating reed.

First, as illustrated in FIG. 1, the main body of the vibrating reed 10 where electrodes are not formed is formed, for example, by processing the piezoelectric body with dry etching. Initially, as illustrated in FIG. 18A, the exterior including the first and the second main surfaces 11 and 12 and the outside surface 13 (13a and 13b) is etched. Then, the groove 50 is etched into the detection unit 40. The groove bottom 51 of the groove 50 is set to be at a desired position by controlling the etching time.

Figure 18B:
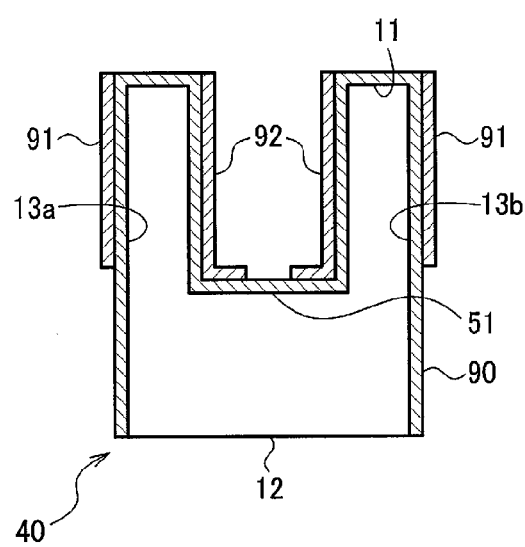

Next, a conductive film 90 is formed on the first and the second main surfaces 11 and 12 and the outside surface 13 (13a and 13b) as illustrated in FIG. 18B. The second main surface 12 is a mounting surface. Accordingly, no films are formed thereon. Then, patterned resist films 91 and 92 are formed on the conductive film 90. The patterning is implemented by a lithography process.

Figure 18C:
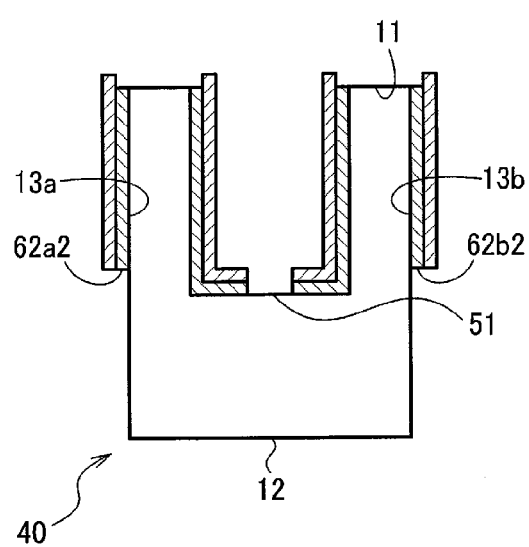

Last, as illustrated in FIG. 18C, part of the conductive film 90 where the resist films 91 and 92 do not cover is removed by etching, and the vibrating reed 10 is completed.

8. Electronic Device and Moving Object

Figure 19:
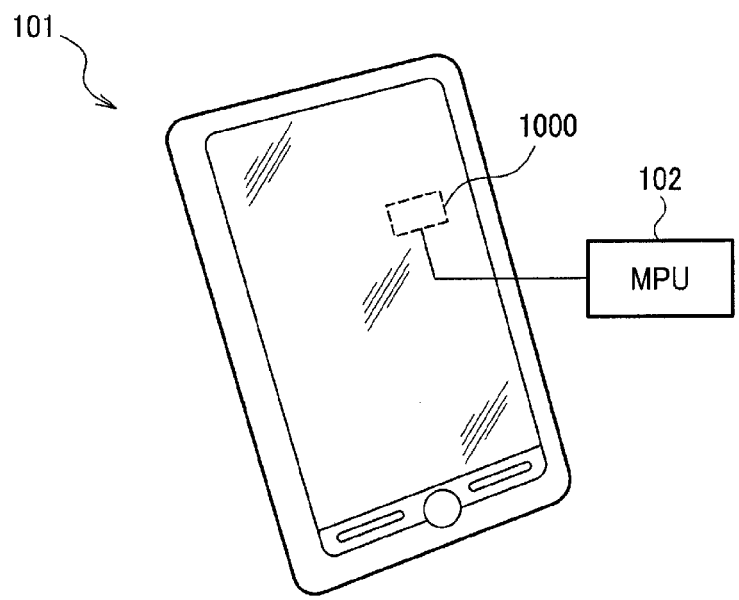
FIG. 19 is a diagram illustrating an example of an electronic device including a gyrosensor.

FIG. 19 schematically illustrates a smartphone 101 as a specific example of an electronic device. The gyrosensor 1000 including the vibrating reed 10 is incorporated into the smartphone 101. The gyrosensor 1000 can detect the position of the smartphone 101. So-called motion sensing is implemented by the gyrosensor 1000. A detection signal from the gyrosensor 1000 can be supplied to, for example, a single-chip microcomputer (MPU) 102. The MPU 102 can run various processes in response to the motion sensing. Besides, the motion sensing can be used in various electronic devices such as mobile phones, mobile game consoles, game controllers, car navigation systems, pointing devices, head-mounted displays, and tablet computers.

Figure 20:
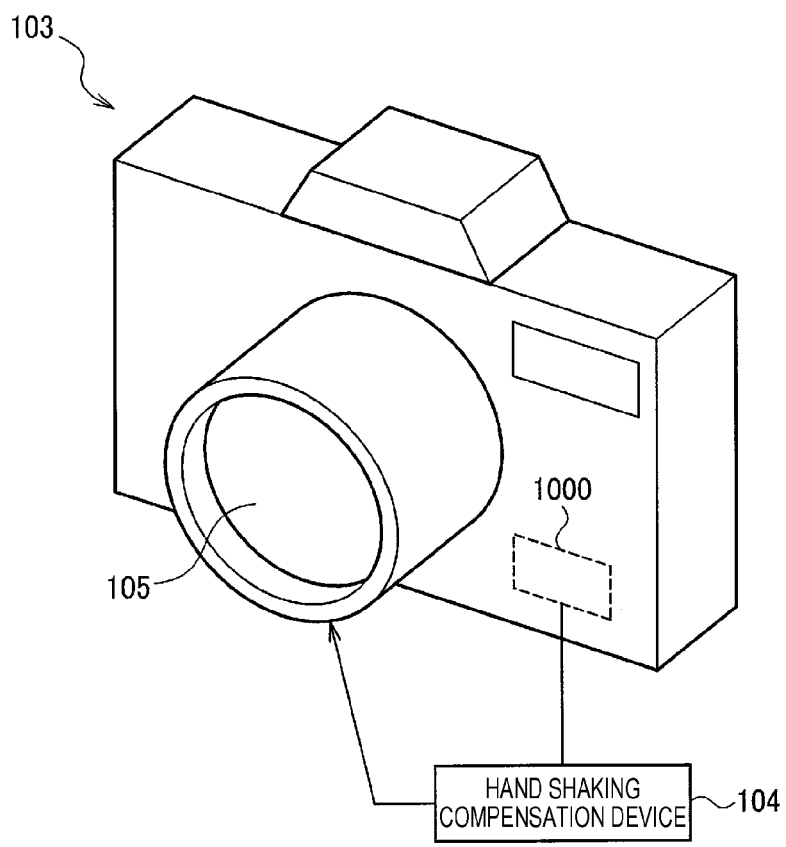
FIG. 20 is a diagram illustrating another example of an electronic device including a gyrosensor.

FIG. 20 schematically illustrates a digital still camera (hereinafter, referred to as "camera") 103 as another specific example of the electronic device. The gyrosensor 1000 including the vibrating reed 10 is incorporated into the camera 103. The gyrosensor 1000 can detect the position of the camera 103. The detection signal from the gyrosensor 1000 can be supplied to a hand shaking compensation device 104. The hand shaking compensation device 104 can move a specific lens in a lens set 105 in response to the detection signal from the gyrosensor 1000. This compensates for panning and tilting of the camera caused by shaking of hands. Besides, the hand shaking compensation can be used in digital video cameras.

Figure 21:
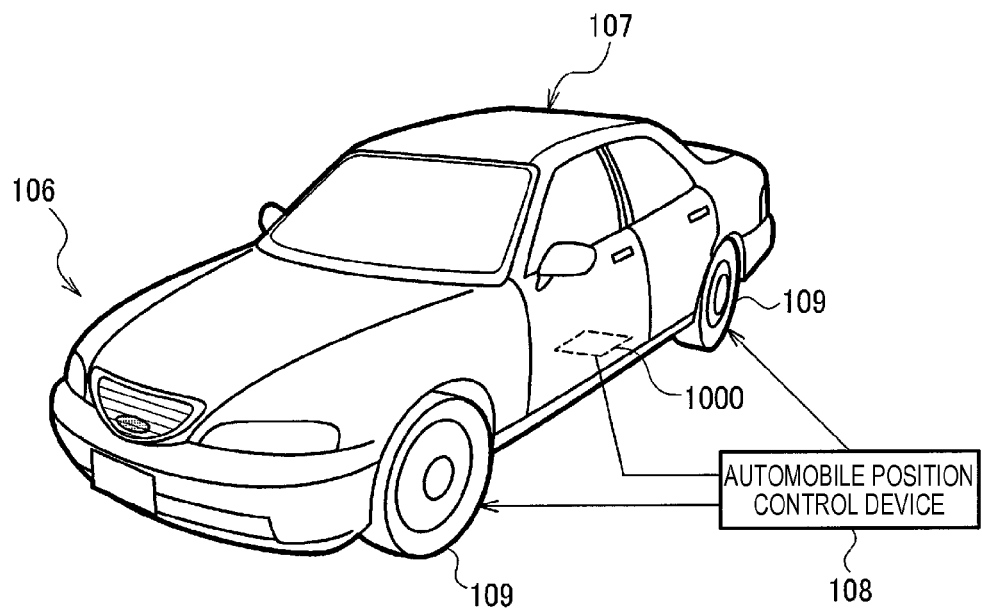
FIG. 21 is a diagram illustrating an example of a moving object including a gyrosensor.

FIG. 21 schematically illustrates an automobile 106 as a specific example of a moving object. The gyrosensor 1000 including the vibrating reed 10 is incorporated into the automobile 106. The gyrosensor 1000 can detect the position of a car body 107. The detection signal from the gyrosensor 1000 can be supplied to an automobile position control device 108. The automobile position control device 108 can control the softness and hardness of a suspension in response to the position of the car body 107 and control brakes for each wheel 109. Besides, the automobile position control can be used in various moving objects such as biped robots, airplanes, and helicopters.

The present embodiment has been described in detail as above. It is easily understood by those skilled in the art that various modifications can be made without substantially departing from the novelty and the effect of the invention. Accordingly, every such modification is included in the scope of the invention. For example, using a quartz crystal as the vibrating reed forming material has been described in the present embodiment and the modification example above. However, other piezoelectric body materials besides the quartz crystal can be used. For example, aluminum nitride (AlN) or oxide substrates such as lithium niobate (LiNbO3), lithium tantalate (LiTaO3), lead zirconium titanate (PZT), lithium tetraborate (Li2B4O7), and langasite (La3Ga5SiO14) substrates, laminated piezoelectric substrates configured by laminating a piezoelectric body material such as aluminum nitride and tantalum pentoxide (Ta2O5) on a glass substrate, or piezoelectric ceramics can be used. Terms used together with broader or heteronymous terms thereof at least once in the specification or the drawings can be replaced with the broader or the heteronymous terms at any place in the specification or the drawings. Configurations and operations of the gyrosensor 1000, the vibrating reed 10, the smartphone 101, the camera 103, the automobile 106, and the like are not limited to the description in the present embodiment, and various modifications can be made.

The entire disclosure of Japanese Patent Application No. 2013-226033, filed Oct. 30, 2013 is expressly incorporated by reference herein.

What is claimed is:

1. A vibrating reed comprising:
   a first main surface and a second main surface of a piezoelectric body, the second main surface being on a back surface of the piezoelectric body with respect to the first main surface;
   an outside surface that connects the first main surface and the second main surface; and
   a detection unit that vibrates in a direction intersecting the first main surface,
   wherein the detection unit includes
      a groove that has a groove bottom at a position between the first main surface and the second main surface in a depth direction from an opening provided in the first main surface,
      a first inside surface and a second inside surface in an inside surface facing the inside of the groove,
      a first outside surface and a second outside surface in the outside surface,
      a first inside surface electrode that is provided on the first inside surface,
      a first outside surface electrode that is provided on the first outside surface,
      a second inside surface electrode that is provided on the second inside surface, and
      a second outside surface electrode that is provided on the second outside surface,
   the piezoelectric body is included between the first outside surface and the first inside surface,
   the piezoelectric body is included between the second outside surface and the second inside surface,
   each of the first outside surface electrode and the second outside surface electrode includes an end surface positioned on the second main surface side in a direction from the first main surface to the second main surface, and
   at least one of the first outside surface and the second outside surface has a non-electrode-formed area where the first outside surface electrode or the second outside surface electrode is not provided in an area from the end surface to the second main surface.

2. The vibrating reed according to claim 1,
   wherein given that G is a detection sensitivity of the vibrating reed, G1 is a detection sensitivity when each end surface of the first outside surface electrode and the second outside surface electrode is provided in the second main surface, and G2 is a detection sensitivity when each end surface of the first outside surface electrode and the second outside surface electrode is provided in a midplane between the first main surface and the second main surface, the following relationship is satisfied: $G1 + (G2-G1) \times 10\% \leq G \leq G2$.

3. The vibrating reed according to claim 2,
   wherein the end surface is positioned at substantially the same position as that of the midplane.

4. The vibrating reed according to claim 2,
   wherein the end surface is positioned between the midplane and the second main surface.

5. The vibrating reed according to claim 2,
   wherein the end surface is positioned between the first main surface and the midplane.

6. The vibrating reed according to claim 2,
wherein the groove bottom is arranged at a position beyond the midplane in the depth direction from the opening.

7. The vibrating reed according to claim 2,
wherein the groove bottom is arranged at substantially the same position as that of the midplane or at a position not beyond the midplane in the depth direction from the opening.

8. The vibrating reed according to claim 2,
wherein the first inside surface electrode and the second inside surface electrode are ground electrodes.

9. The vibrating reed according to claim 1,
wherein the end surface is positioned at substantially the same position as that of the midplane.

10. The vibrating reed according to claim 1,
wherein the end surface is positioned between the midplane and the second main surface.

11. The vibrating reed according to claim 1,
wherein the end surface is positioned between the first main surface and the midplane.

12. The vibrating reed according to claim 1,
wherein the groove bottom is arranged at a position beyond the midplane in the depth direction from the opening.

13. The vibrating reed according to claim 1,
wherein the groove bottom is arranged at substantially the same position as that of the midplane or at a position not beyond the midplane in the depth direction from the opening.

14. The vibrating reed according to claim 1,
wherein the first inside surface electrode and the second inside surface electrode are ground electrodes.

15. The vibrating reed according to claim 1,
wherein the first outside surface electrode and the second outside surface electrode are ground electrodes.

16. The vibrating reed according to claim 1, further comprising a pair of main surface electrodes arranged on the second main surface at an interval.

17. An angular velocity sensor comprising:
the vibrating reed according to claim 1; and
a detection circuit that detects an angular velocity on the basis of a vibration of the vibrating reed in the thickness direction.

18. An electronic device comprising the angular velocity sensor according to claim 17.

19. A moving object comprising the angular velocity sensor according to claim 17.

20. A method for manufacturing a vibrating reed that includes a first main surface and a second main surface of a piezoelectric body, the second main surface being on a back surface of the piezoelectric body with respect to the first main surface; an outside surface that connects the first main surface and the second main surface; and a detection unit that vibrates in a direction intersecting the first main surface, the method comprising:
    forming a main body of the detection unit including a first outside surface and a second outside surface of the outside surface which face each other, and a groove that has a groove bottom at a position between the first main surface and the second main surface in a depth direction from an opening provided in the first main surface;
    forming a first outside surface electrode and a second outside surface electrode respectively on the first outside surface and the second outside surface;
    forming a first inside surface electrode and a second inside surface electrode respectively on the first inside surface that is opposite the first outside surface and is facing the inside of the groove and the second inside surface that is opposite the second outside surface and is facing the inside of the groove; and
    removing an electrode over an area having a predetermined length from the second main surface in at least one of the first outside surface electrode and the second outside surface electrode.

* * * * *